(12) United States Patent
Videen et al.

(10) Patent No.: US 10,859,694 B2
(45) Date of Patent: Dec. 8, 2020

(54) METHOD AND APPARATUS FOR LIGHTNING THREAT INDICATION

(71) Applicants: USTAV STAVEBNICTVA A ARCHITEKTURY SAV, Bratislava (SK); UNIVERZITA KOMENSKEHO BRATISLAVE, Bratislava (SK); Gorden Videen, Adelphi, MD (US)

(72) Inventors: Gorden Videen, Adelphi, MD (US); Miroslav Kocifaj, Bratislava (SK); Jozef Klačka, Bratislava (SK)

(73) Assignees: USTAV STAVEBNICTVA A ARCHITEKTURY SAV, Bratislava (SK); UNIVERZITAKOMENSKEHOBRATISLAVE, Bratislava (SK); Gorden Videen

( * ) Notice: Subject to any disclaimer, the term of this patent is extended or adjusted under 35 U.S.C. 154(b) by 275 days.

(21) Appl. No.: 15/105,560

(22) PCT Filed: Dec. 19, 2014

(86) PCT No.: PCT/SK2014/000024
§ 371 (c)(1),
(2) Date: Jun. 16, 2016

(87) PCT Pub. No.: WO2015/094130
PCT Pub. Date: Jun. 25, 2015

(65) Prior Publication Data
US 2016/0320483 A1    Nov. 3, 2016

(30) Foreign Application Priority Data
Dec. 19, 2013    (SK) ..................... 114-2013

(51) Int. Cl.
*G01S 13/95* (2006.01)
*G01W 1/16* (2006.01)
*G01R 29/08* (2006.01)

(52) U.S. Cl.
CPC .......... *G01S 13/95* (2013.01); *G01R 29/0842* (2013.01); *G01W 1/16* (2013.01)

(58) Field of Classification Search
CPC ....... G01S 13/95–958; G01R 29/0842; G01W 1/16; E03B 3/34
See application file for complete search history.

(56) References Cited

U.S. PATENT DOCUMENTS

| 4,792,806 A | 12/1988 | Bent et al. |
| 5,140,523 A | 8/1992 | Frankel et al. |

(Continued)

FOREIGN PATENT DOCUMENTS

| EP | 0186402 A2 | 7/1986 |
| JP | H09329672 A | 12/1997 |

OTHER PUBLICATIONS

Qiu, S., B.-H. Zhou, L.-H. Shi, W.-S. Dong, Y.-J. Zhang, and T.-C. Gao (2009), An improved method for broadband interferometric lightning location using wavelet transforms, J. Geophys. Res., 114, D18211, doi: 10.1029/2008JD011655. (Year: 2009).*

(Continued)

*Primary Examiner* — Matthew M Barker
(74) *Attorney, Agent, or Firm* — Millman IP Inc.

(57) ABSTRACT

The invention describes a method of monitoring of increased risk of lightning on the basis of information about the increase of electric charge of water droplets, which are obtained by measuring the characteristics of scattered EM radiation. The change of these characteristics is related to the electric charge, which the droplets acquire. In order to normalize the optical characteristics as well as the concen- (Continued)

tration of droplets it is necessary that the measurements are carried out at two suitably selected wavelengths. The wavelengths can be combined, allowing the use of two or more wavelengths.

7 Claims, 4 Drawing Sheets

(56) References Cited

U.S. PATENT DOCUMENTS

| | | | |
|---|---|---|---|
| 5,621,410 A | 4/1997 | Gray et al. | |
| 6,405,134 B1 | 6/2002 | Smith et al. | |
| 6,586,920 B1 | 7/2003 | Hirakawa | |
| 6,828,911 B2 | 12/2004 | Jones et al. | |
| 7,069,258 B1 | 6/2006 | Bothwell | |
| 7,242,343 B1 * | 7/2007 | Woodell | G01S 7/41 |
| | | | 342/26 B |
| 7,307,576 B1 * | 12/2007 | Koenigs | G01S 7/062 |
| | | | 342/26 R |
| 7,511,467 B2 * | 3/2009 | Jantunen | G01R 29/0842 |
| | | | 324/72 |
| 7,772,826 B2 * | 8/2010 | Jantunen | G01W 1/16 |
| | | | 324/72 |
| 2011/0090111 A1 | 4/2011 | Stagliano, Jr. | |

OTHER PUBLICATIONS

J. Klacka and Kocifaj M., "On the scattering of electromagnetic waves by a charged sphere," Progress in Electromagnetics Research, vol. 109, pp. 17-35 (2010).

H. R. Pruppacher, J. D. Klett, Microphysics of Clouds and Precipitation, Atmospheric and Oceanographic Sciences Library, Springer Netherlands, ISBN 0-7923-4409-X, pp. 930 (2010).

J. Klacka and M. Kocifaj, "Scattering of electromagnetic waves by charged spheres and some physical consequences," J. Quantitative Spectrosc. and Radiative Transfer 106, 170-183 (2007).

Kocifaj, Miroslav et al., "Backscatter in a cloudy atmosphere as a lightning-threat indicator", Journal of Quantitative Spectroscopy & Radiative Transfer, vol. 150, pp. 175-180, Elsevier B.V., Jan. 2015.

PCT/SK2014/000024, International Search Report & Written Opinion, dated Mar. 25, 2015.

* cited by examiner

METHOD AND APPARATUS FOR LIGHTNING THREAT INDICATION

FIELD OF THE INVENTION

The technical solution concerns the field of applied meteorology, mainly the use of information about the state of electric charge of water droplets to indicate the lightning threat for various applications.

DESCRIPTION OF THE RELATED ART

Currently, methods for analyzing the electric potential can be used to forecast the chance of electromagnetic (EM) discharge during storms. These methods most commonly use technologies based on the evaluation of radar and thermal data. One of the methods using the radar system operates, for example, on the principle of coherent and incoherent correlation of parallel and cross-polarized radar echo signals. The electric charge causes a distortion of the droplet shape, and the received signal depends on the shape of droplets. This method is ambiguous as droplet shape also can change due to other factors such as wind shear. The degree of non-sphericity of droplets can be estimated on the basis of the analysis of the correlation coefficient, and consequently the potential occurrence of lightning can be indicated.
Other patents related to lightning detection are as follows:
U.S. Pat. No. 4,792,806, Lightning position and tracking method
U.S. Pat. No. 5,140,523, Neural network for predicting lightning
U.S. Pat. No. 5,621,410, Remote prediction of lightning hazards
U.S. Pat. No. 6,405,134, Method and apparatus for predicting lightning threats based on radar and temperature data
U.S. Pat. No. 6,586,920, Lightning detector
U.S. Pat. No. 6,828,911, Lightning detection and prediction alarm device
U.S. Pat. No. 7,069,258, Weather prediction method for forecasting selected events
U.S. Pat. No. 4,792,806, Lightning position and tracking method
Other solutions focused on lightning threat indication are as follows:
US2011090111 A1 20110421
The solution operates on the basis of recognition and classification of forms of hydrometeors from polarimetric radar measurements: signals with different polarization are used.
JPH09329672 A 19971222
The solution according to this patent uses vertically and horizontally polarized waves, and on the basis of their change in the received radar echo, the shape of the particles is considered and subsequently, to the probability of storms.
EP0186402 A2 19860702
This solution uses an antenna for the detection of the E- and H-components of the electric and magnetic field. The extent of storm activity is evaluated as a function of the magnetic field measured in two frequencies.
The drawbacks of the prior art solutions are that they are highly dependent on external factors, such as wind shear, that affects the morphology of particles, and thus can affect the interpretation of measured data. Misinterpretation of measured data can lead to a false indication of a potential threat of discharge, i.e. lightning, thus unnecessarily causing economic losses for example in the operation of airports.

SUMMARY OF THE INVENTION

The invention, according to the proposed solution, constitutes a method of monitoring of increased risk of lightning on the basis of information about the increase of electric charge of water droplets, which is obtained by measuring the characteristics of the scattered electromagnetic (EM) radiation. A change of these characteristics is related to the electric charge, which the droplets acquire, and not with the deformation of droplets, thereby solving to a great extent the drawbacks of the prior art solutions. In order to normalize the optical characteristics as well as the concentration of droplets, it is necessary that measurements are carried out at two suitably selected wavelengths. The suitable wavelengths can be arbitrarily combined, which explicitly includes the possibility of using two or more wavelengths.

The method of lightning threat indication is based on the fact that the information about the electric charge of water droplets is obtained by measuring the signal of backscattering of the electromagnetic radiation at two wavelengths. The operational range of wavelengths is from 1 to 50 mm; whereas, the dimension of monitored atmospheric particles is by at least two orders of magnitude smaller. Thresholds are set on the apparatus for lightning threat indication, then the two signals measured at two different wavelengths are monitored and compared. If the ratio of the two signals remains constant, it is a situation without risk of lightning threat. If the ratio of these two signals is increased by at least the threshold, the situation is assessed as a risk in terms of lightning threat.

The threshold of the apparatus for lightning threat indication is set so that two arbitrary wavelengths are selected from the range 1 mm to 50 mm, and complex refractive indices of the droplets at both wavelengths are assessed from the tables. Subsequently, the theoretical difference between the signals without electric charge and the signals with electric charge is calculated. If the difference (N) is less than 10%, other wavelengths must be selected. If the difference N is greater than 10%, the selected wavelengths are applicable for the apparatus and the presence of electrically charged droplets will be indicated by a signal ratio difference at the level of at least 0.75 N.

The suitable wavelengths can be arbitrarily combined, which implicitly includes the possibility of using two or more wavelengths.

The apparatus, which indicates the lightning threat according to this invention, consists of a transmitter, a receiver, a control unit, a computer system and a data storage unit. In the computer system is bidirectionally connected to the control unit and to the data storage unit, within which, data are processed and calculations are performed, wherein the output information from the computer system is the generation and sending of a signal with warning of lightning risk.

The transmitter transmits at two or more different wavelengths. The electromagnetic wave is transmitted toward the cloud in which scattering by individual droplets takes place. The scattered waves propagate in all directions and the waves that travel back to the transmitter are detected by the receiver, which is located close to the transmitter. The components of the signal are separated using an electronic circuit or a computer program. After obtaining the signal intensity at both wavelengths, the ratio of these signals is evaluated by a computer system: if during monitoring of this ratio a change of the value of at least 0.75N is recorded, the change will be interpreted by the control unit as a threat risk of lightning and the control unit will automatically generate and send a signal with a warning of lightning risk.

With the increase of electric charge of water droplets in the atmosphere the probability of lightning occurrence also increases. As shown in [J. Klačka and M. Kocifaj, "Scattering of electromagnetic waves by charged spheres and some physical consequences," J. Quantitative Spectrosc. and Radiative Transfer 106, 170-183 (2007) and J. Klačka and Kocifaj M., "On the scattering of electromagnetic waves by a charged sphere," Progress In Electromagnetics Research, Vol. 109, 17-35 (2010)], the electric charge affects also the optical characteristics of light and other electromagnetic (EM) radiation.

Recently published theoretical work [J. Klačka and M. Kocifaj, "Scattering of electromagnetic waves by charged spheres and some physical consequences," J. Quantitative Spectrosc. and Radiative Transfer 106, 170-183 (2007)] has shown that the electric charge on droplets can affect the characteristics of the scattered EM signal. Changes of this signal are related to several parameters. First, significant changes in the properties of the signal can be expected only in the case of droplets that are much smaller than the wavelength of the incident radiation. Also, the material properties of droplets are very important. Droplets with properties close to dielectrics have a greater effect on the EM radiation than those having metallic properties.

FIG. 1 shows a plot of the ratio of the backscattering efficiency of a charged spherical droplet $Q_{bk}$ (c) to that of an uncharged droplet $Q_{bk}$ as a function of size parameter $x=2\pi\alpha/\lambda$, where $\alpha$ is the radius of the water droplet and $\lambda$ is the wavelength of incident light. Curves are shown for two different wavelengths of EM radiation, at which the water droplets have different refractive indices. Different values of charge are also considered. What is evident from these curves is that the scattered EM signal is predominantly affected by the electric charge. In the case of large droplets, the ratio of backscatter efficiencies is equal to one; thus, it is identical to the asymptotic course, when we observe no effect of the charge on the scattering. However, it is obvious that the values of parameter x, for which a dependence of backscattering on electric charge can be observed, are affected by the amount of electric charge. The region in which the effect of electric charge becomes apparent is called the transition region. For solid curves in FIG. 1, this transition region is observed in the range of x~0.002 to 0.01.

To highlight the changes during backscattering we have used a thick and a thin curve. The position of the transition region depends on the complex refractive index of the droplets and also on the wavelength of the incident radiation. In the case of a smaller refractive index and dielectric properties of the droplets, the transition region shifts towards larger values of the parameter x.

According to Pruppacher and Klett [H. R. Pruppacher, J. D. Klett, Microphysics of Clouds and Precipitation, Kluwer Academic Publishers, ISBN 0-7923-4409-X, pp. 930], the amount of elementary charge that can be placed onto a water droplet ranges from 1 to $10^8$, depending on the size of the droplet. The larger the droplet, the greater can be the charge. In calculations of the scattering from charged droplets, it is important to take this effect into consideration.

FIG. 2 shows a plot of the charge as a function of droplet radius. In the case of (lightning) discharges, we can expect similar amounts of charge.

In FIG. 3, the calculations of backscattering efficiency are presented, wherein the course of values of electric charge according to FIG. 2 has been taken into account. The radius of the particles varied in the range from 0.01 to 100 micrometers and the calculations were performed for three wavelengths. We have chosen these three discrete wavelengths so that the refractive index of the droplets increases with the increasing wavelength. At the smallest wavelength, the particles have rather dielectric properties, and we observe the largest changes in the backscattering efficiency of small charged droplets. At the largest wavelength, these changes are the smallest, and the particles have metallic properties.

We designate $A(\alpha; \lambda_1{:}\lambda_2)$ to be the ratio of backscattering efficiencies of charged and uncharged droplets at two wavelengths:

$$A(a; \lambda_1; \lambda_2) = \frac{\dfrac{Q_{bk}(c)(\lambda_1)}{Q_{bk}(\lambda_1)}}{\dfrac{Q_{bk}(c)(\lambda_2)}{Q_{bk}(\lambda_2)}}.$$

the variable $\alpha$ in the above mentioned relation is the droplet radius. When analyzing the ratio $A(\alpha; \lambda_1{:}\lambda_2)$ as a function of droplet radius, we can find the transition region that separates the first part dependent on electric charge with values of A>1 from the second part with values of A nearly indistinguishable from one. We are interested in the first region and the ratio mentioned above is designated as $A(\lambda_1{:}\lambda_2)$.

$$A(\lambda_1{:}\lambda_2)A(\alpha<5\ \mu m;\lambda_1{:}\lambda_2)$$

The backscattering intensity measured by the detector is a superposition of the intensities of the scattered radiation generated by all droplets visible within the field of view of the apparatus.

In a first-order approximation of the scattering, the intensity of detected radiation for each of the above mentioned wavelengths is determined by the single scattering from the droplets, thus, for instance, the total intensity is $$I(\lambda) = \sum_i I_i(\lambda),$$

where $I_i$ is the intensity of backscattered light from the i-th droplet. Because the droplets are much smaller than the wavelength, the scattering by uncharged droplets can be described using the Rayleigh scattering approximation:

$$I_i^{uncharged} = I_0 \frac{x_i^4 a_i^2}{r_i^2} \left| \frac{m_i^2 - 1}{m_i^2 + 2} \right|^2 = Q_{bk,i} I_0 \frac{a_i^2}{4r_i^2},$$

where $I_0$ is the intensity of the incident radiation, and for the i-th droplet we define: $x_i$ as the size parameter, $\alpha_i$ as the droplet radius, $m_i$ as the complex refractive index, $r_i$ as the distance from the detector and $Q_{bk,i}$ as the backscattering efficiency. The size parameter is defined as $x_i=2\pi\alpha_i/\lambda$, where $\lambda$ is the wavelength of incident radiation.

By measuring the backscattering intensities at two wavelengths we can calculate the value of the ratio $$R(\lambda_1:\lambda_2) = \frac{I_0(\lambda_1)\sum_i Q_{bk,i}\frac{a_i^2}{r_i^2}}{I_0(\lambda_2)\sum_i Q_{bk,i}\frac{a_i^2}{r_i^2}} = \frac{I_0(\lambda_1)\sum_i \frac{a_i^6}{r_i^2\lambda_1^2}\left|\frac{m_i^2(\lambda_1)-1}{m_i^2(\lambda_1)+2}\right|^2}{I_0(\lambda_2)\sum_i \frac{a_i^6}{r_i^2\lambda_2^2}\left|\frac{m_i^2(\lambda_2)-1}{m_i^2(\lambda_2)+2}\right|^2},$$

which is a constant independent of number and size of droplets, as these are much smaller than the wavelength. When the droplets are charged, this ratio will be $$R(c)(\lambda_1:\lambda_2) = \frac{I_0(\lambda_1)\sum_i Q_{bk,i}(c)(\lambda_1)\frac{a_i^2}{r_i^2}}{I_0(\lambda_2)\sum_i Q_{bk,i}(c)(\lambda_2)\frac{a_i^2}{r_i^2}}$$

When considering cloud particles, whose radii correspond to the first region with A>1, we can select such wavelengths, for which there is little or no dependence on $Q_{bk}(c)/Q_{bk}$; i.e., $$c(\lambda_n) = \frac{Q_{bk,i}(c)(\lambda_n)}{Q_{bk,i}(\lambda_n)},$$

and so we obtain $$\frac{R(c)(\lambda_1:\lambda_2)}{R(\lambda_1:\lambda_2)} = \frac{c(\lambda_1)}{c(\lambda_2)} = A(\lambda_1:\lambda_2).$$

This result has the following meaning: by measuring the backscatter signals of EM radiation at the two wavelengths, it is found that the ratio of these two signals remains constant in the case of a conventional aqueous cloud, regardless of size or number of droplets. However, from the moment at which the charging of droplets starts to occur to the moment at which there is a potential threat of lightning, the ratio of signals of scattered radiation will increase proportionally to the factor $A(\lambda_1:\lambda_2)$.

DETAILED DESCRIPTION OF THE INVENTION

Figure 1:
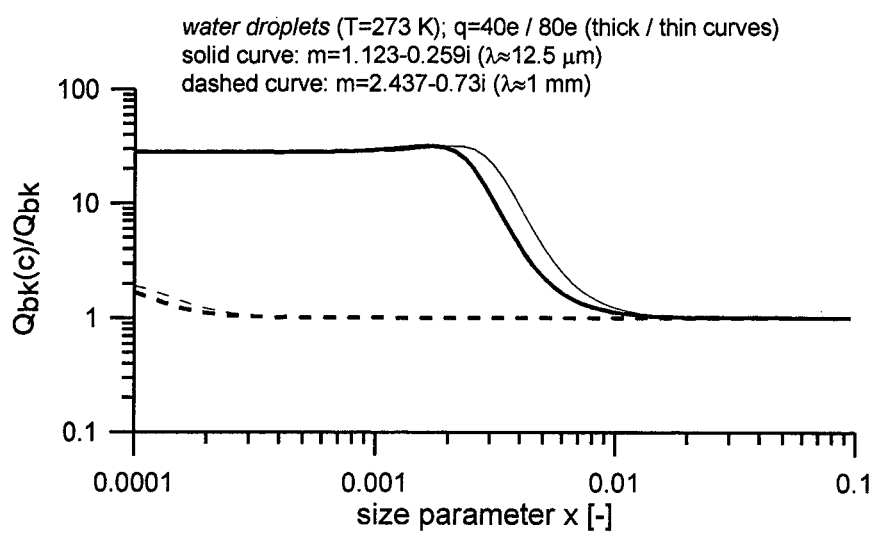
FIG. 1: Ratio of backscattering efficiencies of charged and neutral droplets as a function of size parameter x.
Figure 2:
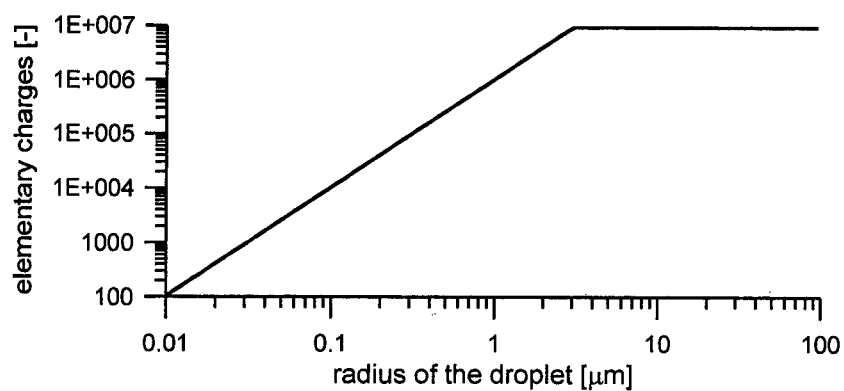
FIG. 2: Plot of electric charge as a function of droplet radius based on the work of Pruppacher a Klett [3].
Figure 3:
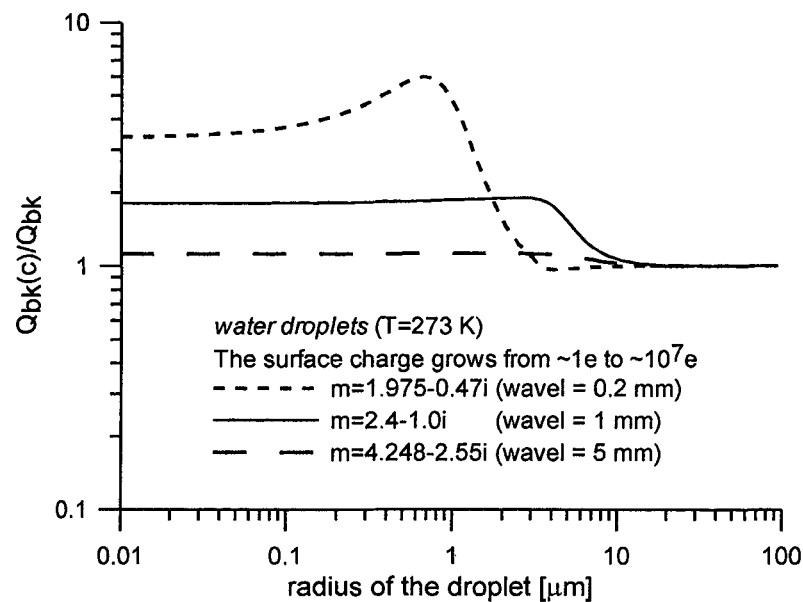
FIG. 3: Ratio of the backscattering efficiencies of charged and uncharged droplets as a function of their radius.
Figure 4:
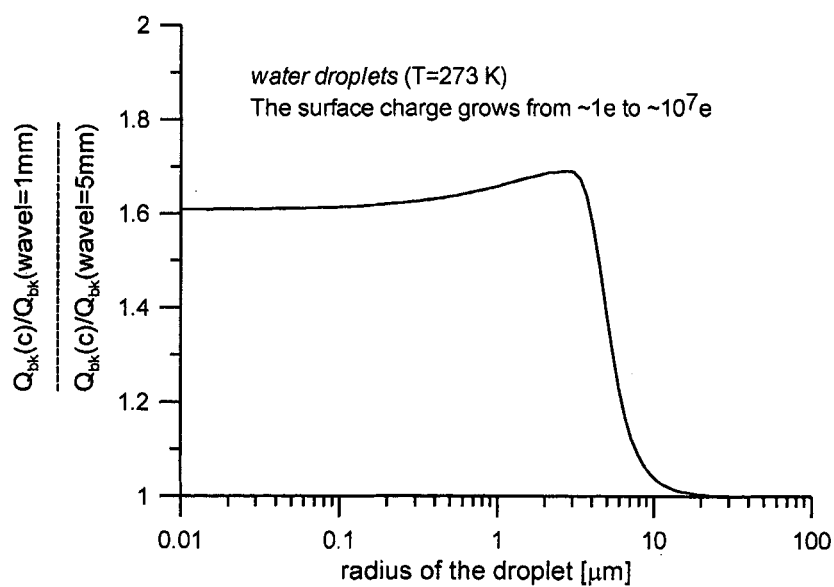
FIG. 4: $A(\alpha; 1\text{ mm}:5\text{ mm})$ as a function of droplet radius.

The technology described in the summary of the invention is realized in practice by means of an apparatus that measures the intensity of backscattering at the two wavelengths. FIG. 4 depicts the calculated ratio A (1 mm:5 mm), for instance, as a function of droplet radius for the case where $\lambda_1=1$ mm and $\lambda_2=5$ mm. This ratio is about 1.6 for particles with radius lower than cca 5 μm. The transition region can be observed for particles with radii of 5-10 μm. For larger particles, the value of the function A asymptotically approaches 1. In the first region with droplet radii of less than ~5 μm, the increase of the signal ratio is of approximately 60%.

Example 1

Figure 5:
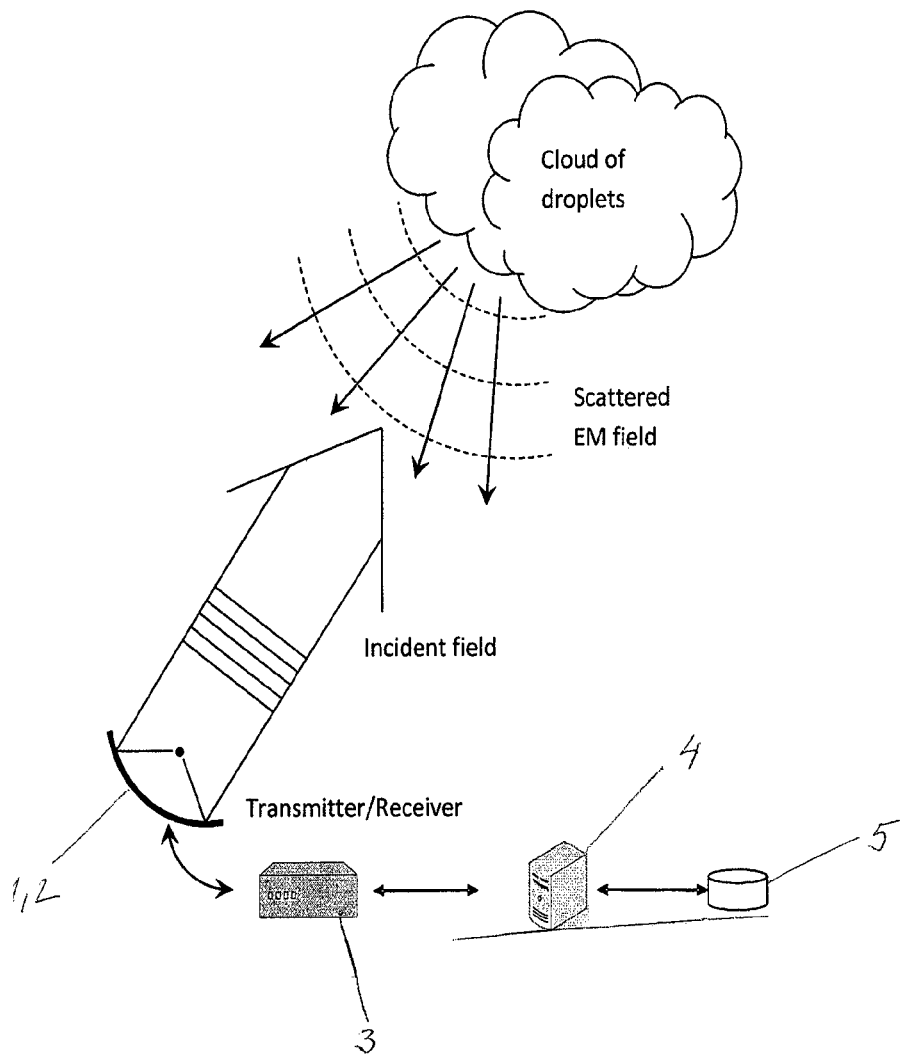
FIG. 5: Possible configuration of the apparatus: a simple configuration of the apparatus with a transmitter and a receiver placed at the same location.

A simple configuration of the apparatus with a transmitter 1 and a receiver 2 located at the same location is depicted in FIG. 5. The transmitter 1 generates EM radiation of two frequencies (or wavelengths) and the generated radiation is directed to the cloud of water droplets. The device can be constructed as radar, in which the source of EM radiation is directed to the clouds. In a traditional configuration, the transmitter 1 and the receiver 2 are simple devices, shaped as a parabola, or they can be separate devices. The wave will be transmitted towards the cloud, in which scattering on individual droplets occurs. Scattered waves propagate in all directions. Those that travel back toward the transmitter 1 are designated as backscattering waves and can be detected by the receiver 2 which is located close to, or collocated with, transmitter 1. The detected signal is a superposition of components of scattered radiation of both wavelengths.

A part of the radiation that is scattered on the droplets travels back and is registered by the receiver 2. The individual components of the intensities for the two wavelengths are recognizable by the computer system 4. The ratio of these intensities is monitored by the control unit 3. The data are stored in the data storage unit 5.

Example 2

The second option is to use several detectors, each of which is tuned so that it collects only a signal of a specific frequency.

Figure 6:
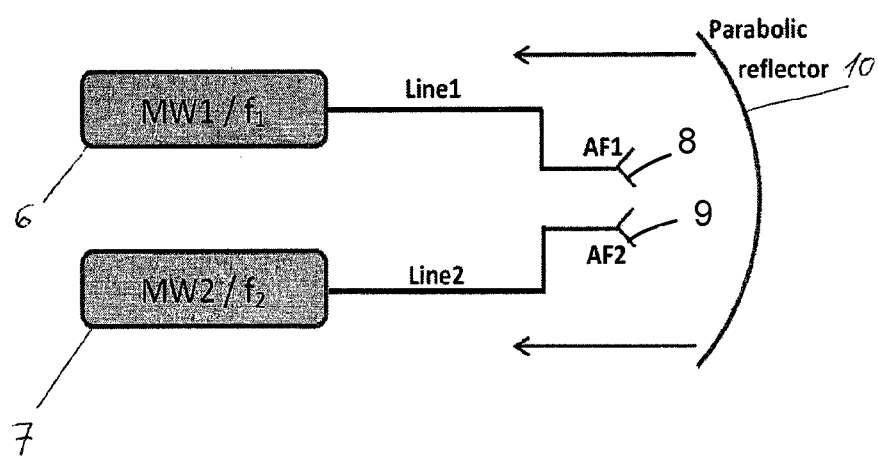
FIG. 6: Example of realization of the apparatus for two frequencies ($f_1$ and $f_2$).

FIG. 6 depicts an example of realization for two frequencies ($f_1$ and $f_2$), where two generators, microwave generator (1) 6 and microwave generator (2) 7, generate microwave radiation with $\lambda_1=1$ mm and $\lambda_2=5$ mm. The signals are sent to irradiator (1) 8 and irradiator (2) 9 and the radiation is then emitted to the atmosphere by means of parabolic reflector 10.

Example 3

Figure 7:
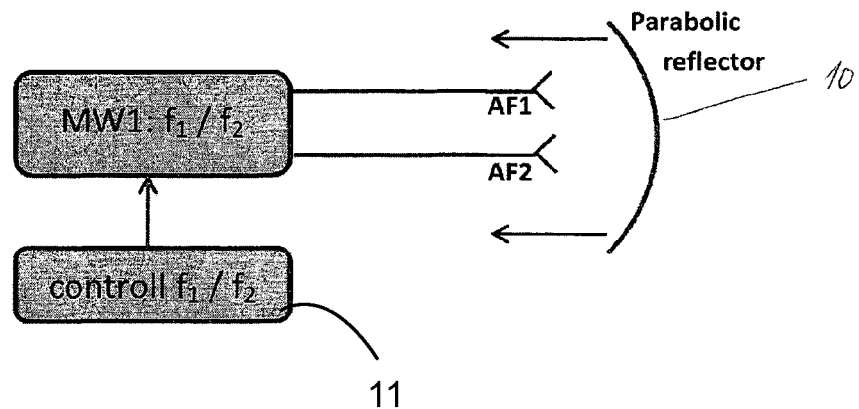
FIG. 7: Example of realization for a microwave generator, in which the switching between the operational frequencies $f_1$ and $f_2$ is controlled by a controller.

Another approach should be adopted in the case when the transmitter works in a pulse mode. Then it is convenient to generate and receive a signal of only one frequency, and subsequently to switch the device to another frequency mode, and after which the whole process is repeated cyclically. The receiver will process a rectangular signal, wherein the frequency will correspond to the frequency of the transmitter. Regardless of how the signal intensities at both wavelengths will be obtained, the ratio of these signals is given by the ratio of both components. If during the monitoring of the ratio $A(\lambda_1:\lambda_2)$, a significant change is registered, this change will be interpreted as a result of electric charge in the clouds, and therefore also as a potential risk of lightning. FIG. 7 depicts the realization for microwave generator 14, in which the switching between operational frequencies $f_1$ and $f_2$ is controlled by controller 11.

Example 4

Figure 8:
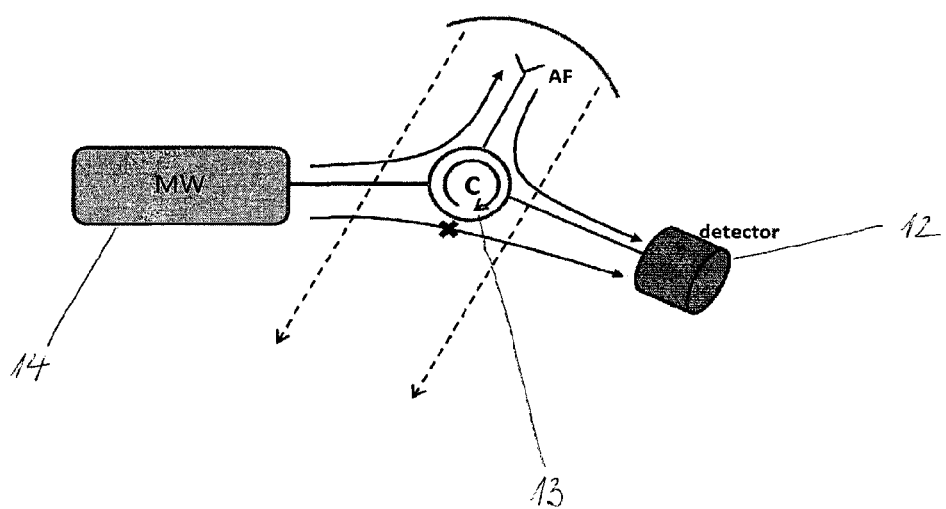
FIG. 8: Example of realization for a solution with a circulator.

FIG. 8 shows a solution with circulator 13 which releases a signal only in a certain direction, and so enables it to lead the signal to the irradiator 8 (AF1) and also to lead the detected signal from the atmosphere to the detector 12. The transition from the MW source—generator 14 to the detector 12 is not possible.

INDUSTRIAL APPLICABILITY

Lightning is particularly dangerous during landing and take-off of an aircraft, where it can cause loss of power or a complete failure of aircraft equipment resulting in catastrophe. To avoid this, airports close during increased lightning threats. However, the disablement of airports is extremely costly and therefore it is economically advantageous for airports to have a device for accurate indication of occurrence of dangerous lightning.

FIGURE LEGEND 1 transmitter
2 receiver
3 control unit
4 computer system
5 data storage unit
6 generator 1
7 generator 2
8 irradiator 1
9 irradiator 2
10 parabolic reflector
11 controller
12 detector
13 circulator
14 microwave generator

The invention claimed is:

1. A method of detecting a lightning threat, comprising:
setting, via a controller, a threshold for detecting a lightning threat for at least two wavelengths of electromagnetic radiation between 1 mm and 50 mm in length;
transmitting the at least two wavelengths of electromagnetic radiation towards at least one cloud;
monitoring, by the controller, a first signal of backscattered electromagnetic radiation of a first of the at least two wavelengths and a second signal of backscattered electromagnetic radiation of a second of the at least two wavelengths;
comparing a relative change in a ratio of the first signal and the second signal to the threshold;
determining that there is an absence of lightning threat if the relative change in the ratio is below the threshold; and
determining that there is a lightning threat if the relative change in the ratio exceeds the threshold.

2. A method of detecting a lightning threat according to claim 1, wherein the threshold is set by:
arbitrarily selecting a first candidate wavelength and a second candidate wavelength of electromagnetic radiation between 1 mm and 50 mm in length;
assessing complex refractive indices of water droplets at each of the first candidate wavelength and the second candidate wavelength from tables;
calculating a theoretical relative difference N between a ratio of a first expected signal of backscattered electromagnetic radiation for the first candidate wavelength and a second expected signal of backscattered electromagnetic radiation for the second candidate wavelength from water droplets without an electric charge, and a ratio of the first expected signal of backscattered electromagnetic radiation for the first candidate wavelength and the second expected signal of backscattered electromagnetic radiation for the second candidate wavelength from water droplets with an electric charge; and
selecting another first candidate wavelength and second candidate wavelength based on a comparison of the theoretical relative difference N and 10%,
wherein, during the setting, the threshold for detecting a lightning threat is set to a relative signal difference of 0.75 N.

3. An apparatus for detecting a lightning threat, comprising:
a transmitter;
at least one receiver;
a control unit configured to control the transmitter and receive signals from the receiver;
a data storage unit; and
a computer system that is bidirectionally connected to the control unit and to the data storage unit, the computer system being configured to:
set a threshold for detecting a lightning threat for at least two wavelengths of electromagnetic radiation between 1 mm and 50 mm in length; and
monitor a first signal of backscattered electromagnetic radiation of a first of the at least two wavelengths and a second signal of backscattered electromagnetic radiation of a second of the at least two wavelengths;
compare a relative change in a ratio of the first signal and the second signal to the threshold;
determine that there is an absence of lightning threat if the relative change in the ratio is below the threshold; and
determine that there is a lightning threat if the relative change in the ratio exceeds the threshold.

4. The apparatus for detecting a lightning threat according to claim 3, wherein the at least one receiver comprises at least two receivers, each of the at least two receivers being tuned to collect only a signal of a specific frequency.

5. The apparatus for detecting a lightning threat according to claim 3, wherein the transmitter comprises a microwave generator operating in pulse mode, wherein the microwave generator repeatedly alternates between a first frequency and a second frequency.

6. The apparatus for lightning threat indication according to claim 3, further comprising a circulator between a microwave generator and a detector, the circulator being configured to limit transmission of a signal from the microwave generator to an irradiator and limit transmission of a signal received via the irradiator to the detector, wherein direct transmission of a signal from the microwave generator to the detector via the circulator is inhibited.

7. The apparatus for lightning threat indication according to claim 3, wherein the at least one threshold of the apparatus for lightning threat indication is set by:

arbitrarily selecting a first candidate wavelength and a second candidate wavelength of electromagnetic radiation between 1 mm and 50 mm in length;

assessing complex refractive indices of water droplets at each of the first candidate wavelength and the second candidate wavelength from tables;

calculating a theoretical relative difference N between a ratio of a first expected signal of backscattered electromagnetic radiation for the first candidate wavelength and a second expected signal of backscattered electromagnetic radiation for the second candidate wavelength from water droplets without an electric charge, and a ratio of the first expected signal of backscattered electromagnetic radiation and the second expected signal of backscattered electromagnetic radiation from water droplets with an electric charge; and selecting another first candidate wavelength and second candidate wavelength based on a comparison of the theoretical relative difference N and 10%, wherein, during the setting, the threshold for detecting a lightning threat is set to a relative signal difference of 0.75 N.

* * * * *